United States Patent [19]

Takashi et al.

[11] 4,408,814
[45] Oct. 11, 1983

[54] ELECTRIC CONNECTOR OF PRESS-CONTACT HOLDING TYPE

[75] Inventors: Nogami Takashi, Tokyo; Masuda Haruhiko, Hasuda, both of Japan

[73] Assignee: Shin-Etsu Polymer Co., Ltd., Tokyo, Japan

[21] Appl. No.: 294,215

[22] Filed: Aug. 19, 1981

[30] Foreign Application Priority Data

Aug. 22, 1980 [JP] Japan .................... 55-115647

[51] Int. Cl.³ .................... H01R 4/00; H01R 9/00
[52] U.S. Cl. .................... 339/59 M; 339/61 M; 339/DIG. 3
[58] Field of Search ........ 339/17 LM, 17 M, DIG. 3, 339/59, 61 R, 61 M

[56] References Cited

U.S. PATENT DOCUMENTS

| | | | |
|---|---|---|---|
| 3,237,341 | 3/1966 | Janning | 339/17 M |
| 3,680,037 | 7/1972 | Nellis et al. | 339/DIG. 3 |
| 3,998,513 | 12/1976 | Kobayashi et al. | 339/17 M |
| 4,003,621 | 1/1977 | Lamp | 339/DIG. 3 |
| 4,008,300 | 2/1977 | Ponn | 339/17 M |
| 4,199,637 | 4/1980 | Sado | 339/59 M |
| 4,201,435 | 5/1980 | Nakamura et al. | 339/17 M |

*Primary Examiner*—John McQuade
*Assistant Examiner*—Paula Austin
*Attorney, Agent, or Firm*—Hopgood, Calimafde, Kalik, Blaustein & Judlowe

[57] ABSTRACT

The electric connector of the invention is of the so-called stratification type formed of an alternate stratification of layers of electrically conductive and insulating rubbers surrounded by zebra-like striped lateral surfaces and having a rectangular cross section in the same manner as in the conventional stratification type connectors. Different from conventional ones, the inventive connector is provided with a plurality of whisker-like projections of electroconductive linear bodies, e.g. carbon fibers or metal wires, which are the end portions of the linear bodies dispersed and embedded in the layers of the conductive rubber in alignment in a direction, on at least one of the striped lateral surfaces in the areas corresponding to the peripheral surfaces of the conductive layers. By virtue of the whisker-like projections, the inventive connector is readily combined with one or more of other connectors of similar type by merely putting them together side by side to establish very reliable electric connection between them because the end portions of the whisker-like projections of the inventive connector run into the conductive layers of the other connector in contact with the former.

5 Claims, 3 Drawing Figures

ELECTRIC CONNECTOR OF PRESS-CONTACT HOLDING TYPE

BACKGROUND OF THE INVENTION

The present invention relates to a novel and improved electric connector of the alternate stratification type of layers of electrically conductive and insulating rubbery materials shaped, for example, in an elongated rod-like form having a rectangular cross section which is used for electrically connecting two circuit boards or the like electronic units by contacting under pressure as held therebetween. More particularly, the invention provides an elastomeric connector of the stratification type having a rectangular cross section, two or more of the connectors of this type being readily assembled and integrated together into one connector having an irregular cross section by being put together side by side. That is, a composite connector having an irregular cross section, e.g. L-shaped, U-shaped, T-shaped or the like cross section, can readily and conveniently be obtained by combining two or more of the unit connectors of the invention and conventional connectors each having a rectangular cross section as if to play with building blocks.

Needless to say, many of the electronic instruments in recent years such as electronic watches, pocketable electronic calculators and the like are assembled with one or more of electric connectors which serve to establish electric connection between two circuit units as between a liquid crystal display unit and a driving circuit board thereof. Such an electric connector is used as being held between the opposite contacting terminal portions of the circuit units with an appropriate contacting pressure.

Among a variety of the types of the electric connectors used for such a use, the most widely used ones are those of the so-called elastomeric stratification type. An electric connector of this type has an elongated rod-like form composed of alternate stratification in the longitudinal direction of the rod with a plurality of layers of electrically conductive and insulating rubbers so that the connector as a whole has a zebra-like appearance on the lateral surfaces and an electroconductivity within the plane perpendicular to the longitudinal direction of the elongated rod but is electrically insulating in the longitudinal direction thereof. Most of the connectors of this type are shaped in a rod-like form having a square of rectangular cross section although connectors having a circular or elliptic cross section are sometimes used according to need.

The connector is used as sandwiched between the oppositely facing contacting terminal portions on two circuit units with an appropriate contacting pressure. When the contacting terminal portions on two circuit units are at the positions just to face oppositely one to the other, the above mentioned connectors having a simple cross section, e.g. square, rectangular, circular or elliptic cross section, can be used with no problems in respect of the cross sectional configuration. When it is desired, however, to electrically connect two contacting terminal portions of the circuit units at somewhat slided positions from each other, a connector of a simple cross section can no longer be used and it is sometimes necessary to use a connector having an irregular cross section such as L-shaped, T-shaped, E-Shaped, U-shaped or the like cross section.

In the prior art, such an electric connector of the stratification type having an irregular cross section is manufactured by integrally molding by use of a metal mold of the desired form or, alternatively, by bonding together adhesively two or more of the connectors of stratification type each having a rectangular cross section side by side to give a desired irregular cross section. The former method is, however, disadvantageous due to the troublesome steps of fabrication resulting in a high production cost of the connector as well as due to the relatively low accuracy in the dimensions of the connector while the latter method is sometimes defective because the electric connection between the unit connectors bonded together is not always very reliable. Further alternatively, an elastomeric connector of stratification type prepared to have a simple cross section, e.g. rectangular cross section, is cut and engraved longitudinally to have a desired irregular cross section but this method must be carried out by handworks using a special jig and is too time- and labor-consuming so that the method is entirely unsuitable for the industrial manufacture of electric connectors having an irregular cross section.

Therefore, none of the prior art methods has been satisfactory when an elastomeric electric connector of the stratification type having an irregular cross section with high performance is to be manufactured with good productivity from the industrial standpoint.

SUMMARY OF THE INVENTION

It is therefore an object of the present invention to provide an elastomeric electric connector of the stratification type having an irregular cross section, e.g. L-shaped, T-shaped, E-shaped, U-shaped or the like cross section, freed from the above described problems and drawbacks in the prior art connectors of the similar type.

Another object of the invention is to provide an elastomeric electric connector of the stratification type which in itself has a simple square or rectangular cross section but can be used as a part of a larger connector of the same type having an irregular cross section by combining side by side with one or more of the inventive or conventional connectors of the same stratification type in a manner as if to play with building blocks so as to give a very reliable electric connection between unit parts of the thus assembled composite connector despite the very simple manner of putting them together.

Thus, the elastomeric electric connector of the stratification type according to the invention has an elongated, e.g. rod-like, configuration with a square or rectangular cross section formed of an alternate multiple stratification of layers of an electrically conductive rubber and electrically insulating rubber along the longitudinal direction of the rod to be imparted with a striped appearance on the lateral surfaces of the rod-like form and at least one of the striped lateral surfaces is provided with a plurality of whisker-like upright projections of electrically conductive linear bodies in the striped areas corresponding to the layers of the electrically conductive rubber.

When the above described inventive connector is put together with another elastomeric connector of the stratification type with the lateral surface having the whisker-like or thorn-like projections contacting with a lateral surface of the other connector side by side, the end portions of the electroconductive whisker-like projections run into the electrically conductive layers of the second connector so that the electric connection or electric contacting condition between them is very reliable even without any elaborate bonding means to put them together with a remarkably small electric resistance across the bonding surface therebetween.

Accordingly, a connector having an irregular cross section can be made with an assemblage of several elastomeric connectors of the stratification type including at least one according to the invention each having a rectangular but different cross section easily and reliably by simply putting them together side by side with a relatively small contacting pressure.

A further advantage obtained with the inventive connector is that a composite connector of any desired thickness can be obtained by stacking a plurality of the inventive connector having a unit thickness one on the other according to the gap space between the electronic circuit units to be electrically connected therewith.

DETAILED DESCRIPTION OF THE PREFERRED EMBODIMENTS

As is understood from the above description, the elastomeric electric connector of the stratification type according to the invention is not particularly different from the connectors of the similar type known in the prior art except for the provision of the whisker-like projections of electroconductive linear bodies held upright on at least one of the lateral surfaces of the elongated rod-shaped connector body in the striped areas corresponding to the layers of the electroconductive rubber alternately stratified with the layers of the electrically insulating rubber along the longitudinal direction of the rod-shaped connector body. Therefore, the requirements in the construction and method for the manufacture of the inventive connector are by and large identical with conventional connectors of the similar type except for that point.

Figure 1:
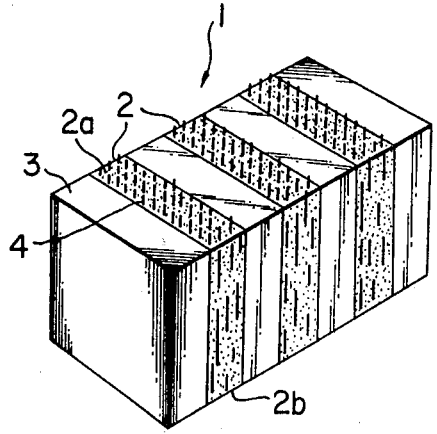
FIG. 1 is a perspective view of an elastomeric electric connector of the stratification type according to the present invention.

FIG. 1 illustrates a perspective view of a basic model of the inventive elastomeric connector 1 composed of an alternate stratification of three layers 2 of an electrically conductive rubber (shaded portions) and four layers 3 of an electrically insulating rubber (white portions) adhesively bonded together along the longitudinal direction of the connector 1 although it is usual that the numbers of the stratified layers 2 and 3 are much larger than above to give an elongated rod-shaped configuration to the connector 1 with a zebra-like striped appearance on the lateral surfaces of the rod 1 having a rectangular cross section. It is of course that the parameters such as the width, height and length of the connector 1 as well as the pitch of the stratification or the thicknesses of the conductive and insulating layers 2,3 are determined according to particular application of the connector in compliance with the conditions of the electronic circuit units to be electrically connected therewith.

The manufacturing procedure of this connector is much the same as in the manufacture of conventional elastomeric connectors of the stratification type. Thus, numbers of sheets are prepared first with an electroconductive rubber and an electrically insulating rubber in a desired thickness. Then, a plurality of these rubber sheets in an uncured state are stacked one on the other alternately and bonded and cured together by pressing with heating into a stratified block which is then sliced in a plane perpendicular to the direction of the stratification to give a striped sheet or plate. This striped sheet or plate is further cut in a desired width along the line perpendicular to the running direction of the stripes into an elongated form of rectangular cross section with striped lateral surfaces.

The rubbery material for the insulating layers may be conventional and any kind of ordinary rubbers including natural rubber and synthetic rubbers may be used. For example, silicafiller reinforced silicone rubbers are suitable for the purpose.

The electroconductivity of the conductive rubber for the layers contributing to the anisotropic electric conduction of the connector is obtained, as is well known, by blending a considerable amount of an electroconductive powdery material, such as carbon black and metal powders, with a rubber stock. The amount of the electroconductive powdery material is of course determined in consideration of the desired electroconductivity and the mechanical properties of the rubber formulated therewith.

Figure 2:
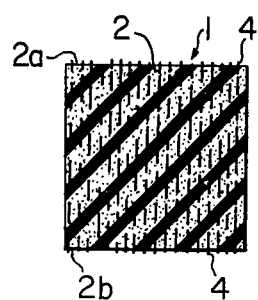
FIG. 2 is a cross sectional view of the inventive connector shown in FIG. 1 in a plane perpendicular to the longitudinal direction including one of the layers of the electroconductive rubber.

Different from conventional elastomeric connectors of the stratification type, the layers 2 of the conductive rubber in the inventive connector must be provided on at least one lateral peripheries 2a, which is a part of one of the lateral surfaces of the rod-shaped connector body 1, with a plurality of whisker-like upright projections of electrically conductive linear bodies 4 as is shown in FIG. 1. FIG. 2 illustrates a cross sectional view of the connector body 1 in a plane perpendicular to the longitudinal direction of the body 1 including one of the electroconductive layers 2. As is shown in this figure, the whisker-like projections 4 appear on both of the oppositely facing peripheral surfaces 2a and 2b. The figure further shows that a large number of the electroconductive linear bodies 4 are also embedded within the layer of the conductive rubber 2 as aligned in one direction and the end portions of several of them are protruded out of the surface to give a whisker-like appearance. In other words, the whisker-like upright projections are provided on the peripheral surfaces 2a and 2b perpendicular to the direction of alignment of the linear bodies 4 and no whisker-like projections are provided on the other two peripheral surfaces perpendicular to the surfaces 2a and 2b.

The conductive rubber layer with the dispersion of the conductive linear bodies 4 therein having the end portions protruded out of the surfaces is obtained in a manner as follows. Thus, a rubber stock such as a silicone rubber is formulated and blended with electroconductive fine linear bodies such as carbon fibers and very thin metal wires in addition to the ordinary conductivity-imparting powdery material such as carbon black and metal powders and the rubber compound thus obtained is then shaped into a sheet of a desired thickness by a method of extrusion molding or calendering. It is essential in this shaping of the rubber sheet that the rubber compound is deformed and molded under a unidirectional shearing force so as to effect the alignment of the linear bodies in the sheet along the direction of the shearing force.

When such a rubber sheet is subjected to curing by heating and cooling, the rubbery matrix necessarily undergoes strong shrinkage. For example, a silicone rubber sheet cured at 180° C. and cooled to room temperature exhibits about 2 to 5% of linear shrinkage based on the length of the uncured sheet. Nevertheless, the linear bodies, e.g. carbon fibers or metal wires, dispersed and embedded in the rubbery matrix are not susceptible to shrinkage so that the linear bodies in the cured rubber sheet are under strong compressive force in the longitudinal direction thereof. Therefore, when an alternately stratified block of such conductive rubber sheets and insulating rubber sheets is cured and cooled followed by slicing and cutting as described before, the abovementioned compressive stress to the linear bodies is released at or near the surface newly formed by slicing or cutting so that the end portions of the linear bodies are protruded out of the surface to give a whisker-like appearance. In other words, the rubbery matrix is under the stretching stress by virtue of the linear bodies embedded therein while the rubber matrix near the surface newly formed by slicing is released from the stressing effect of the linear bodies to freely shrink with consequently protruded end portions of the linear bodies appearing out of the surface giving a whisker-like appearance.

As is mentioned before, the electroconductive linear bodies embedded in the matrix of the electroconductive rubber may be carbon fibers or thin metal wires. The diameter of these fibers or wires suitable in the invention is naturally determined according to particular applications of the connector within a range from 1 to 200 μm. The amount of these linear bodies in the electroconductive rubber is determinant of the density of the whisker-like projections on the peripheral surfaces of the conductive layers. When carbon fibers are used, for example, from 1 to 100 parts by weight or, preferably, from 3 to 20 parts by weight of the carbon fibers are incorporated into 100 parts by weight of the conductive rubber so that a density of the whisker-like projections of 100 to 300 per square millimeter is obtained on the peripheral surface of the conductive rubber layer in an example. The largest length of the whisker-like projections protruded out of the surface is about 40 μm although dependent on various parameters.

It is of course that the elastomeric electric connectors of the stratification type shown in FIG. 1 according to the invention may be used in just the same way for electrically connecting two electronic circuit units as the conventional connectors. An advantage obtained in the use of the inventive connector for such applications is that, even when the contacting surface of the connector is covered with a thin layer of an adhesive or a greasy material as is often the case in electronic instruments, the electric connection between the contacting terminal portion of the circuit unit and the contacting surface of the connector is very reliable with remarkably low electric resistance across the bonding surface by virtue of the projections of the conductive linear bodies penetrating the covering layer and reaching the contacting terminals of the circuit unit to establish electric connection even under a smaller contacting pressure than in the conventional connectors.

Figure 3:
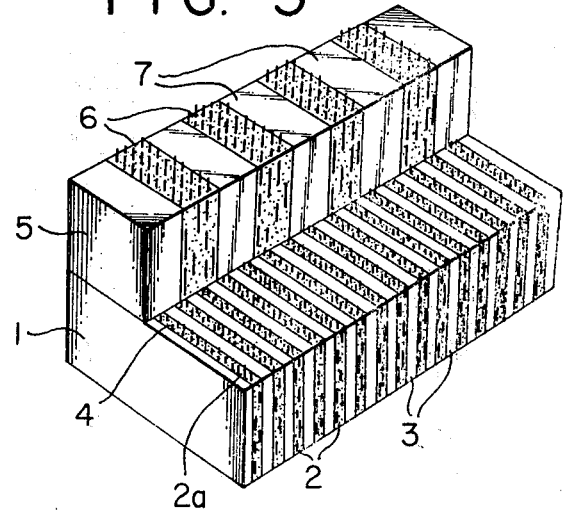
FIG. 3 is a perspective view of a composite electric connector having an L-shaped cross section composed of two unit connectors, each according to the invention, put together side by side.

The largest advantage of the invention, however, is the possibility of obtaining a composite connector having an irregular cross section as mentioned before by combining two or more of unit connectors each being of the stratification type and having a rectangular cross section. FIG. 3 is a perspective view of a typical composite connector obtained by use of a unit connector according to the invention. The composite connector having an L-shaped cross section shown in FIG. 3 is composed of two unit connectors, one of which is the connector 1 according to the present invention in the form of an alternately stratified body of the conductive layers 2 and the insulating layers 3. The whisker-like upright projections of the electroconductive linear bodies 4 appear on the upper peripheral surface 2a of each of the conductive layers 2. The other one of the unit connectors is the connector 5 put on the former connector 1 side by side and composed of the alternate stratification of the conductive layers 6 and the insulating layers 7 in the same manner as in the former inventive connector 1 though with a different pitch. When the second connector 5 is put on the first connector 1 and pressed together, the end portions of the whisker-like projections 4 protruded on the surface of the first connector 1 run into the conductive layers 6 of the second connector 5 so that very reliable electric connection is obtained between the first and the second connectors. It is optional that the second connector 5 may be a conventional elastomeric connector of the stratification type or a connector according to the invention provided with a plurality of whiskerlike projections of conductive linear bodies protruded on one of the lateral surfaces of the rod-shaped connector 5 in the portions corresponding to the conductive layers 6. In this case, the whisker-like projections are provided on the downward surface in contact with the contacting surface of the first connector 1. The pitch of the alternate stratification in the second connector 5 is preferably the same as in the first connector 1 but may be different according to need as shown in FIG. 3. The unit connectors 1 and 5 may be bonded together preferably by use of an adhesive on the contacting surfaces between them if desired. The electric connection between the unit connectors is not badly affected even by the use of the adhesive owing to the presence of the whisker-like projections of the conductive linear bodies bridging the two connectors penetrating the layer of the adhesive.

The above described principle of combining two or more of the unit connectors, of which at least one is a connector according to the invention, together to form a single composite connector is of course applicable to connectors having a more complicated cross sectional configuration such as U-shaped, T-shaped, E-shaped and F-shaped cross sections according to need in addition to the composite connector having an L-shaped cross section illustrated in FIG. 3. It is desirable in this case that the bonding surfaces between the unit connectors are all perpendicular to the direction of the contacting pressure when the composite connector is sandwiched and held between two electronic circuit units under a contacting pressure to make electric connection therebetween because of the safety from possible separation of the unit connectors which may take place when the bonding is made otherwise.

Following is an example to illustrate a composite connector having an L-shaped cross section as shown in FIG. 3 composed of two unit connectors each provided with whisker-like projections of carbon fibers on the contacting surfaces of them, in which the electric resistance across the bonding surface therebetween is remarkably small in comparison with a similar but conventional connector.

EXAMPLE

An electroconductive silicone rubber compound was formulated with 60 parts by weight of an organopolysiloxane gum for silicone rubber, 40 parts by weight of an acetylene black, 5 parts by weight of carbon fibers having a diameter of 7 to 8 μm and chopped in about 3 mm length and 3 parts by weight of the curing agent for the silicone rubber containing 50% by weight of dicumyl peroxide. Two kinds of elastomeric electric connectors according to the invention were prepared with the above obtained conductive silicone rubber compound and an insulating silicone rubber. The pitches of the stratification and the thicknesses of each of the conductive layers in these connectors (called A and B hereinafter) were 0.25 mm or 0.10 mm and 0.17 mm or 0.05 mm for the connectors A or B, respectively. The density of the whisker-like projections of the carbon fibers protruded on the peripheral surfaces of the conductive layers was about 140 per square millimeter and most of these projections had lengths of 5 to 25 μm with the maximum value of the length of about 40 μm. The specific resistivity of the conductive silicone rubber as cured was $2 \times 10^{-3}$ ohm.cm.

The above prepared two connectors were put together side by side with their striped lateral surfaces in contact with each other and the electric resistance between one of the conductive layers in the connector A and the conductive layer in the connector B in contact with the former layer in the connector A was determined by use of gold-plated electrodes. The values of the electric resistance varied from 2 to 10 kiloohms from layer to layer indicating that the resistance across the bonding surface under the contacting pressure was from zero to about 8 kiloohms with the intralayer resistance equal to about 1 kiloohm for each of the connectors A and B.

For comparison, similar elastomeric connectors were prepared but without formulating the carbon fibers in the conductive silicone rubber and similar measurements of the electric resistance were conducted. In this case, the electric resistance ranged from about 100 kiloohms to about $10^6$ kiloohms indicating that the electric resistance across the bonding surface was extremely large so that no practically applicable composite connector could be obtained.

What is claimed is:

1. An elastomeric electric connector of the stratification type in the form of an alternately stratified body having a rectangular cross section formed of a plurality of layers of an electrically conductive rubber and a plurality of layers of an electrically insulating rubber bonded together and surrounded by the lateral surfaces each having a striped appearance made of the peripheral surfaces of the alternately stratified layers of the rubbers, in which a plurality of whisker-like upright projections of electrically conductive linear bodies are provided on at least one of the lateral surfaces of the striped appearance in the areas corresponding to the peripheral surfaces of the layers of the electrically conductive rubber.

2. The elastomeric electric connector as claimed in claim 1 wherein the whisker-like upright projections of the electrically conductive linear bodies are the end portions of the linear bodies dispersed and embedded in the electrically conductive rubber as aligned in the direction perpendicular to the peripheral surface of the layer on which the projections are provided.

3. The elastomeric electric connector as claimed in claim 1 wherein the electrically conductive linear bodies are carbon fibers or metal wires.

4. A composite elastomeric electric connector of the stratification type composed of at least two unit elastomeric electric connectors of the stratification type, each in the form of an alternately stratified body having a rectangular cross section formed of a plurality of layers of an electrically conductive rubber and a plurality of layers of an electrically insulating rubber bonded together and each being surrounded by the lateral surfaces each having a striped appearance made of the peripheral surfaces of the alternately stratified layers of the rubbers, put together side by side with the lateral surfaces thereof being in contact with each other, in which the lateral surface of at least one of the unit connectors in contact with lateral surface of the other unit connector is provided with a plurality of whisker-like upright projections of electrically conductive linear bodies in the areas corresponding to the peripheral surfaces of the layers of the electrically conductive rubber with the end portions of the said whisker-like projections reaching the layers of the electrically conductive rubber in the other unit connector.

5. The composite elastomeric electric connector as claimed in claim 4 wherein the unit elastomeric electric connectors are adhesively bonded together at the lateral surfaces thereof through a layer of an adhesive intervening therebetween with the whisker-like upright projections penetrating completely through the layer of the adhesive.

* * * * *